United States Patent
Bolash et al.

[11] Patent Number: 6,161,915
[45] Date of Patent: Dec. 19, 2000

[54] IDENTIFICATION OF THERMAL INKJET PRINTER CARTRIDGES

[75] Inventors: John Philip Bolash; Mark Joseph Edwards; Edmund Hulin James, III, all of Lexington; George Keith Parish, Winchester; David Howard White, Lexington, all of Ky.

[73] Assignee: Lexmark International, Inc, Lexington, Ky.

[21] Appl. No.: 09/099,814

[22] Filed: Jun. 19, 1998

[51] Int. Cl.$^7$ .............................. B41J 29/393; B41J 2/175
[52] U.S. Cl. ................................ 347/19; 347/86; 439/67; 439/955
[58] Field of Search .............................. 347/19, 1, 5, 50, 347/211, 86; 399/12, 13; 439/67, 955

[56] References Cited

U.S. PATENT DOCUMENTS

| | | | |
|---|---|---|---|
| 3,899,968 | 8/1975 | McDevitt | 101/111 |
| 4,742,431 | 5/1988 | Igarashi | 361/398 |
| 4,803,521 | 2/1989 | Honda | 399/12 |
| 4,806,106 | 2/1989 | Mebane et al. | 347/50 X |
| 4,872,027 | 10/1989 | Buskirk et al. | 347/19 |
| 4,930,915 | 6/1990 | Kikuchi et al. | 347/211 X |
| 5,033,887 | 7/1991 | Bäuerle | 400/175 |
| 5,049,904 | 9/1991 | Nakamura et al. | 347/19 |
| 5,099,219 | 3/1992 | Roberts | 337/297 |
| 5,289,242 | 2/1994 | Christensen et al. | 399/12 |
| 5,363,134 | 11/1994 | Barbehenn et al. | 347/49 |
| 5,398,053 | 3/1995 | Hirosawa et al. | 347/13 |
| 5,427,537 | 6/1995 | Savovic et al. | 439/67 X |
| 5,504,507 | 4/1996 | Watrobski et al. | 347/19 |
| 5,521,692 | 5/1996 | Bares | 399/26 |
| 5,541,631 | 7/1996 | Hashimoto | 347/86 |
| 5,592,881 | 1/1997 | Rabjohns | 101/483 |
| 5,748,209 | 5/1998 | Chapman et al. | 347/50 |
| 5,757,394 | 5/1998 | Gibson et al. | 347/19 |

FOREIGN PATENT DOCUMENTS 9-39265  2/1997  Japan.

Primary Examiner—Susan S. Y. Lee
Attorney, Agent, or Firm—Luedeka, Neely & Graham; Michael T. Sanderson

[57] ABSTRACT

The invention relates to an apparatus for providing information to a printer controller in order to identify the type of printer cartridge installed in a thermal ink jet printer. The apparatus includes a printer cable containing a set of electrically-conductive wires connected to contacts in a printer cable connector. The contacts of the printer cable connector make physical connection to an identification circuit on the printer cartridge. The identification circuit includes an electrical conductor which is at an electrical reference potential. When none, or one or more contacts on the cable connector are in electrical contact with the electrical conductor of the identification circuit, a signal corresponding to the identification of the printer cartridge is produced which is used by the printer controller to determine the type of printer cartridge installed in the printer. Selective contact between the connector contacts and the identification circuit, so as to produce an electrical code, may be obtained using a label having apertures, contact pads, electrical traces, or a combination thereof. Accordingly, various cartridge identification codes can be produced using various methods which allow encoding of the information on a cartridge during or after the manufacture of the cartridge body is substantially complete.

25 Claims, 18 Drawing Sheets

ENCODING LABEL CONFIGURATION:          ID CODE:
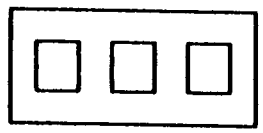          1 1 1
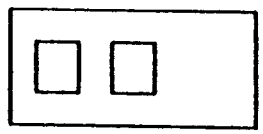          1 1 0
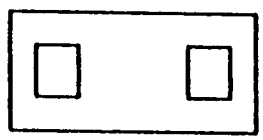          1 0 1
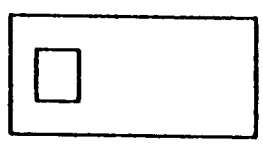          1 0 0
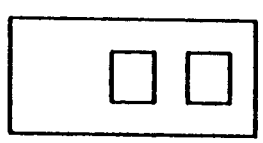          0 1 1
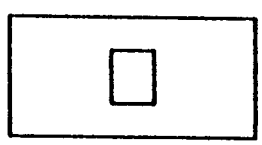          0 1 0
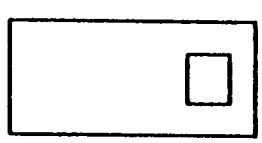          0 0 1
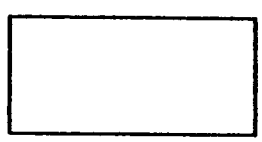          0 0 0
*Fig.* 3C ENCODING CIRCUIT CONFIGURATION:     ID CODE:
1 1 1
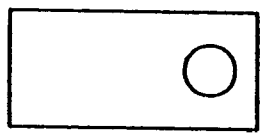
1 1 0
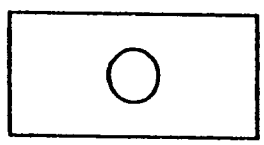
1 0 1
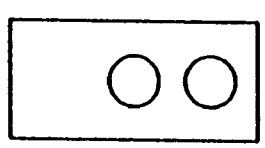
1 0 0
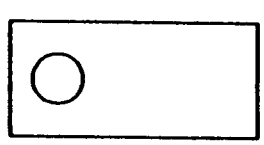
0 1 1
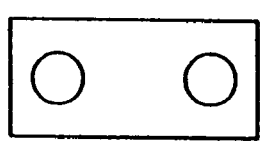
0 1 0
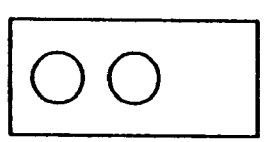
0 0 1
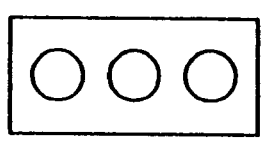
0 0 0
*Fig.* 6B

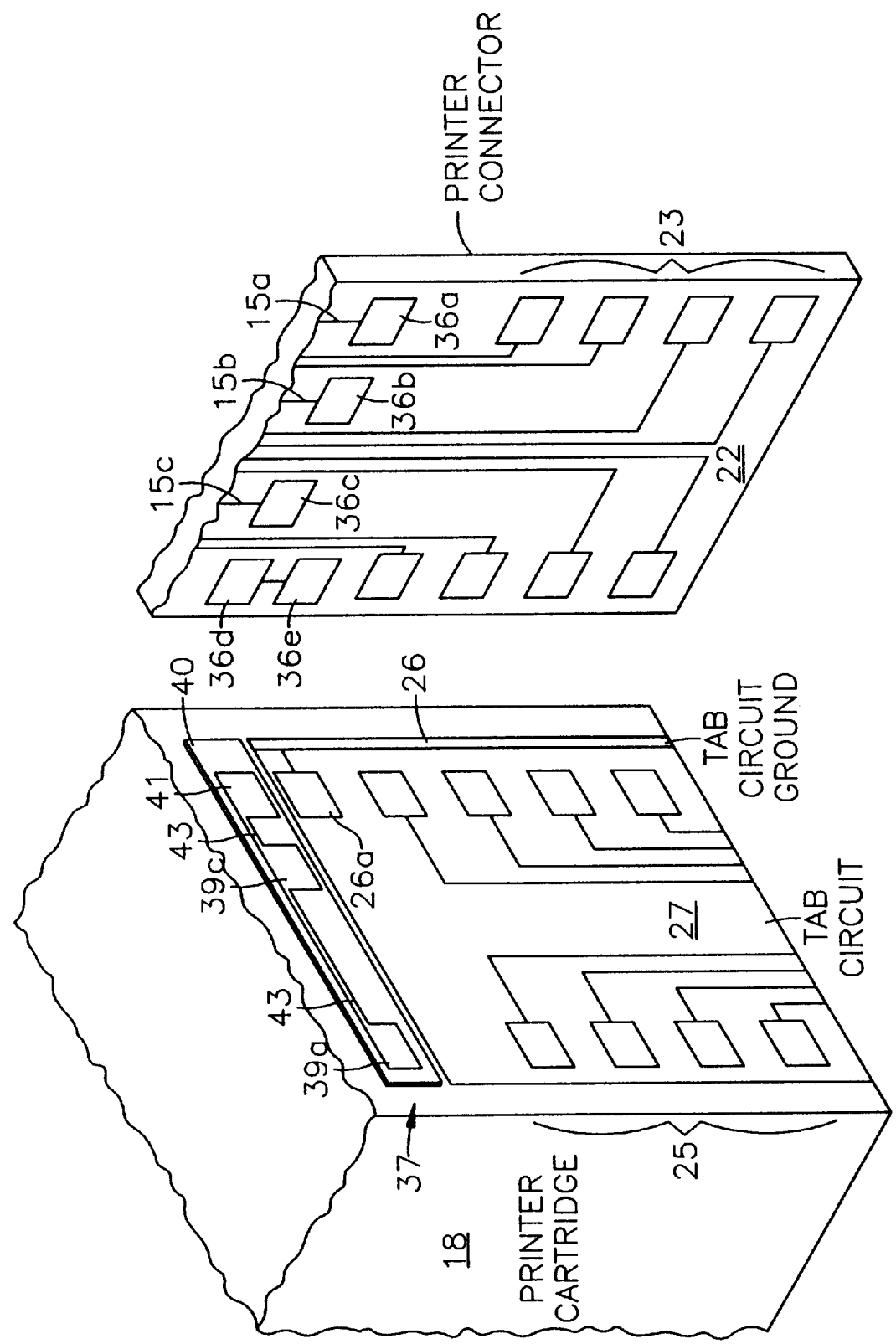

ENCODING CIRCUIT CONFIGURATION:     ID CODE:
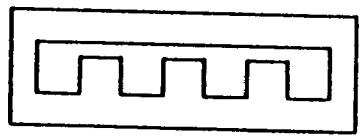
1 1 1
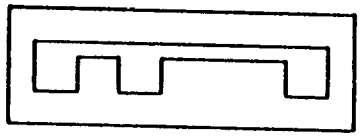
1 1 0
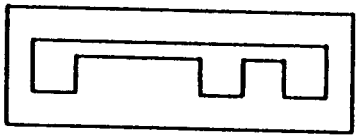
1 0 1
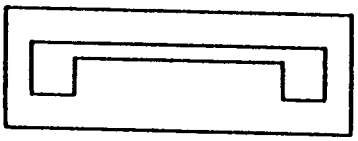
1 0 0
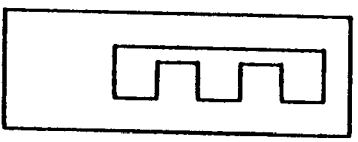
0 1 1
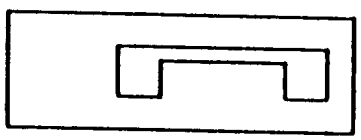
0 1 0
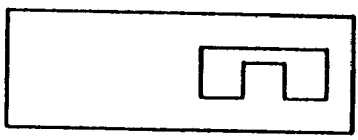
0 0 1
0 0 0
*Fig.* 7B

IDENTIFICATION OF THERMAL INKJET PRINTER CARTRIDGES

FIELD OF THE INVENTION

The present invention is generally directed to ink jet printers, and is more particularly directed to an identification circuit attached to the printer cartridge of an ink jet printer for the encoding of cartridge-specific information.

BACKGROUND OF THE INVENTION

Thermal ink jet printers apply ink to a print medium by ejecting small droplets of ink from an array of nozzles located in the printhead of a printer cartridge. An array of thin-film resistors on an integrated circuit on the printhead selectively generates heat as current is passed through the resistors. The generated heat causes ink contained within an ink reservoir to boil and be ejected from the array of nozzles that is adjacent to the resistor array. A printer controller determines which resistors will be "fired" and the proper firing sequence so that the desired pattern is printed on the medium.

Many multicolor ink jet printers accommodate replaceable ink cartridges containing multiple colors of ink as well as replaceable cartridges containing a single color of ink. The printer controllers of these printers require input of information identifying the type of cartridge that is installed so that the controllers are adjusted for proper printer operation with the installed cartridge. User interface is typically required to identify to the printer controller the type of cartridge installed.

In order to reduce the cost and complexity of printer cartridge manufacturing processes, it is desirable for all cartridges to be constructed with a similar configuration to the extent possible regardless of the type of cartridge or color of ink it contains. Thus it is desirable to maintain uniformity of cartridge configurations at least until the time that the cartridges are loaded with ink which typically occurs near the completion of the cartridge assembly process. However, maintaining a uniform cartridge configuration makes it difficult to easily identify the contents of the cartridge or the particular cartridge being used.

An object of the invention is to provide a relatively simple and inexpensive apparatus for encoding information on a printer cartridge.

Another object of the invention is to provide cartridge-specific information, such as ink color and type, on the cartridge in a manner that is detectable by the printer controller so that the controller is adjusted automatically without the need for user intervention.

A further object of the invention is to provide an encoding system which can be configured for a wide variety of printer cartridge types.

SUMMARY OF THE INVENTION

With regard to the above and other objects, the invention provides an apparatus which supplies information to a printer controller in order to identify the type of cartridge installed in an ink jet printer. The apparatus comprises a printer cable containing a set of electrically-conductive wires, each wire having a first end and a second end, with the first end of each of the wires being electrically connected to a voltage source. A printer connector has a set of electrically-conductive contacts which are connected to the second end of the printer cable wires, and which physically contact an identification circuit. The identification circuit, which is disposed upon the cartridge, contains an electrical conductor which is at an electrical reference potential. The identification circuit also includes a planar label which is attached to the cartridge. The label is composed of an electrically-nonconductive material having an adhesive material on one of its surfaces for adhesively attaching the label to the printer cartridge adjacent to the electrical conductor. The label covers and electrically insulates at least a portion of the electrical conductor to prevent the electrical conductor from making electrical connection with one or more of the printer connector contacts. The label has no apertures, or one or more apertures which expose one or more areas of the electrical conductor to electrical connection with one or more of the contacts. An input circuit is connected to the first ends of the printer cable wires for sensing which of the wires are at the reference potential. The input circuit also provides input signals to the printer controller corresponding to the wires which are at the reference potential.

According to the invention, the printer cartridge identification information is encoded by means of an adhesively-attached label. By encoding the identification information by means of an adhesively-attached label, the information can be easily incorporated into the printer cartridge at the end of the cartridge manufacturing process. Accordingly, only one cartridge design is required for a wide variety of inks and other services that the cartridge may perform.

In a preferred embodiment of the invention, the electrical conductor of the identification circuit includes one or more sense pads consisting of discrete areas of electrically-conductive material disposed upon a printer cartridge TAB circuit. Each of these sense pads are at a reference potential. A non-conductive encoding label having no apertures, or one or more apertures is adhesively applied to the cartridge in alignment with the sense pads on the TAB circuit. The label selectively permits or prevents connection between the sense pads and the connector contacts. In this manner, the printer cartridge identification information is encoded by the configuration of the apertures in the adhesively attached nonconductive label.

In another embodiment of the invention, the identification circuit includes an electrically-conductive planar strip which is at a reference potential. The strip has an adhesive material on one of its surfaces for adhesively attaching the strip to the printer cartridge. The identification circuit has no apertures, or one or more apertures in the strip which are positioned to coincide with one or more discrete connector contact points. The presence of one or more apertures preclude one or more of the connector contacts from making electrical connection to the strip. When there is no aperture, all of the connector contacts make electrical connection to the strip. In this manner, the printer cartridge identification information is encoded by the configuration of apertures in the adhesively-attached conductive strip.

In yet another embodiment of the invention, the electrical conductor of the identification circuit includes a planar label composed of electrically-nonconductive material. The label has an adhesive material on one of its surfaces for adhesively attaching the label to the printer cartridge. No sense pads, or one or more sense pads consisting of discrete areas of electrically-conductive material, are disposed upon the label. These sense pads, which are at a reference potential, are positioned on the label to coincide with one or more discrete connector contact points. Printer cartridge identification information is encoded by the number and position of the sense pads on the adhesively-attached label.

In another aspect, the invention provides an apparatus for providing thermal ink jet printer cartridge identification information to a printer controller to identify the cartridge installed in the printer, where the cartridge contains a printhead having an any of resistive heating elements. The apparatus includes a printer cable containing electrically-conductive wires, each having a first end and a second end. The apparatus also includes a printer connector having electrically-conductive contacts which are electrically connected to the second end of the printer cable wires, and which physically contact an identification circuit on the printer cartridge. The identification circuit, which is integral to a TAB circuit on the cartridge, contains an electrical conductor which is at an electrical reference potential relative to the array of resistive heating elements. The apparatus further includes means for precluding none, or one or more of the connector contacts from being at the reference potential relative to the array circuit of resistive heating elements, and means for enabling none, one or more of the contacts to be at the reference potential relative to the array circuit of resistive heating elements. An input circuit is connected to the first end of each of the printer cable wires for sensing which of the wires are at the reference potential relative to the electrical conductor on the printer cartridge, and for providing input signals to the printer controller corresponding to the wires which are at the reference potential.

BRIEF DESCRIPTION OF THE DRAWINGS

Other aspects and advantages of the invention are provided by the following detailed description of preferred embodiments considered in conjunction with the following drawings, which are not to scale so as to better show the detail, in which like reference numerals denote like elements throughout the several views, and wherein:

FIG. 3C illustrates encoding label configurations and corresponding identification codes provided by the label configurations according to the invention;

FIG. 6B depicts encoding circuit configurations and corresponding identification codes according to the invention;

FIG. 7A depicts an encoding circuit of a printer cartridge identification circuit which is nonintegral with a printhead TAB circuit according to the invention;

FIG. 7B depicts encoding circuit configurations and corresponding identification codes according to the invention;

DETAILED DESCRIPTION OF THE INVENTION

Figure 1:
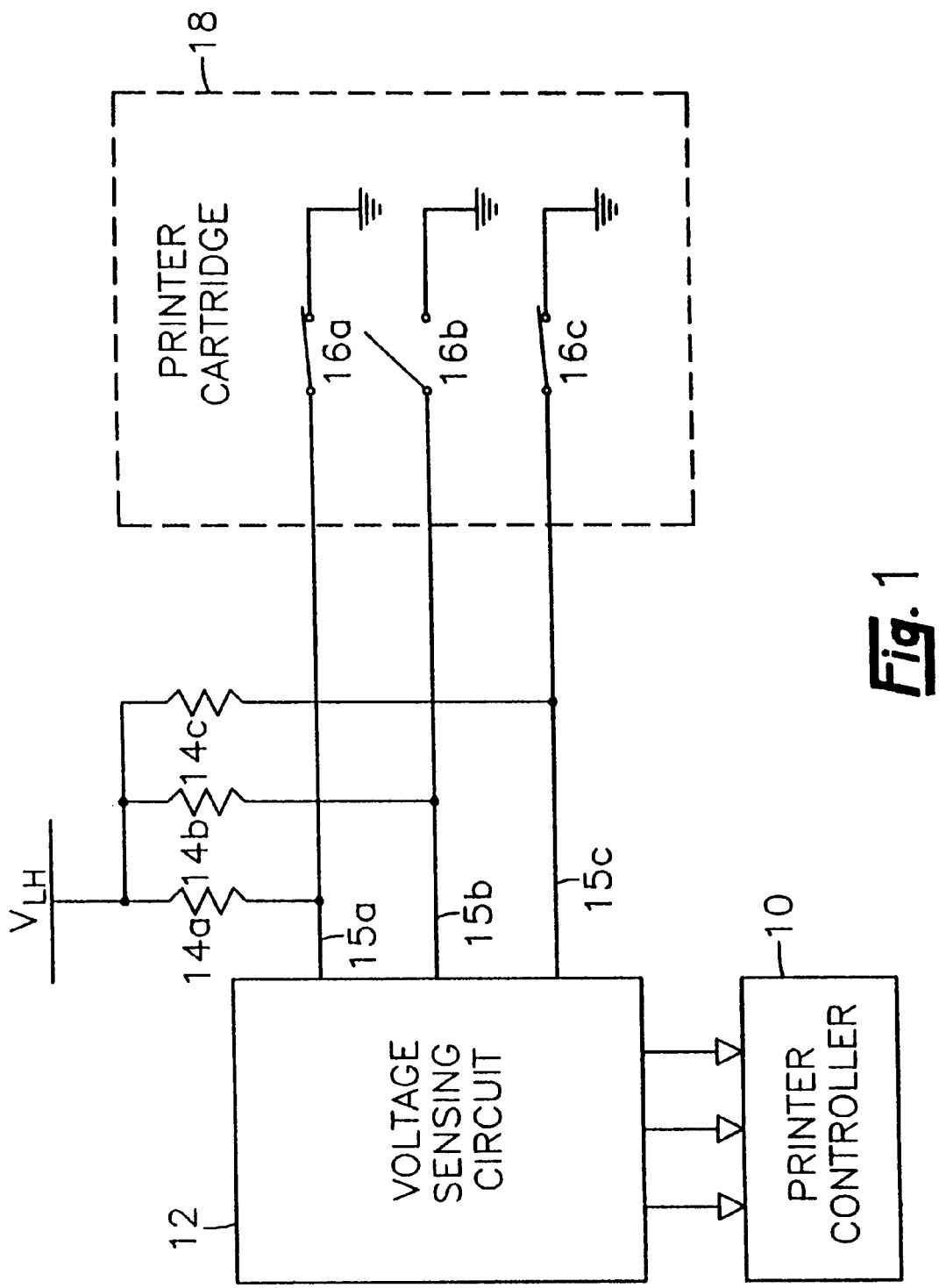
FIGS. 1 and 2 are schematic diagrams of printer cartridge identification circuits according to the invention.

The overall concept of the printer cartridge identification circuit according to the invention is illustrated in FIG. 1. As shown in FIG. 1, a printer controller 10 receives an electrical signal from a voltage sensing circuit 12 which senses voltage levels on each of three identification (ID) lines 15a, 15b, and 15c. A source voltage $V_{LH}$ is supplied to the ID lines 15a, 15b, and 15c through the bias resistors 14a, 14b, and 14c. Depending on the state of three encoding switches 16a, 16b, and 16c located on the printer cartridge 18, the sensed voltage levels on the ID lines 15a, 15b, and 15c are either $V_{LH}$ or ground (0 volts). For example, if the encoding switches 16a and 16c are closed with the encoding switch 16b open as shown in FIG. 1, then the voltage sensing circuit 12 senses 0 volts on the ID lines 15a and 15c, and senses $V_{LH}$ on the ID line 15b. The voltage sensing circuit 12 passes signals to the printer controller 10 which are indicative of the voltage levels sensed on the ID lines 15a, 15b, and 15c. The printer controller 10 interprets the signals from the voltage sensing circuit 12 as identifying a particular type of printer cartridge installed in the printer. Two possible voltage levels ($V_{LH}$ or 0) on three ID lines provide for eight ($2^3$) possible combinations. It should be appreciated that the number of possible combinations may be increased/decreased by a power of 2 by adding/removing a single ID line and encoding switch to/from the circuit of FIG. 1.

In the preferred embodiment of the invention, the voltage levels on the ID lines 15a, 15b, and 15c will be either $V_{LH}$ or ground potential depending on the states of the switches 16a, 16b, and 16c. However, it should be appreciated that the voltage level on the right side of the switches 16a, 16b, and 16c could be any reference potential which can be differentiated from the source voltage $V_{LH}$. Therefore, either $V_{LH}$ or a reference potential are sensed on the ID lines 15a, 15b, and 15c depending on the states of the switches 16a, 16b, and 16c. In the preferred embodiment of the invention, the reference potential is ground potential. Although for the sake of clarity, the reference potential is referred to as ground potential in the description of the invention, the invention is not limited to sensing only ground as the reference potential on the ID lines 15a, 15b, and 15c.

Although the circuit shown in FIG. 1 uses switches as the encoding means to establish or break the electrical path to ground for each of the ID lines 15, it should be appreciated that various other encoding means may be employed for this purpose. Regardless of the encoding means used, since the purpose of the encoding means is to encode identification information which is specific to each printer cartridge, it is desirable for the encoding means to be an integral part of the printer cartridge 18. This specification describes several embodiments of the invention which encode printer cartridge identification information utilizing various encoding means, wherein each embodiment provides a similar electrical function as the circuit represented in FIG. 1.

Figure 2:
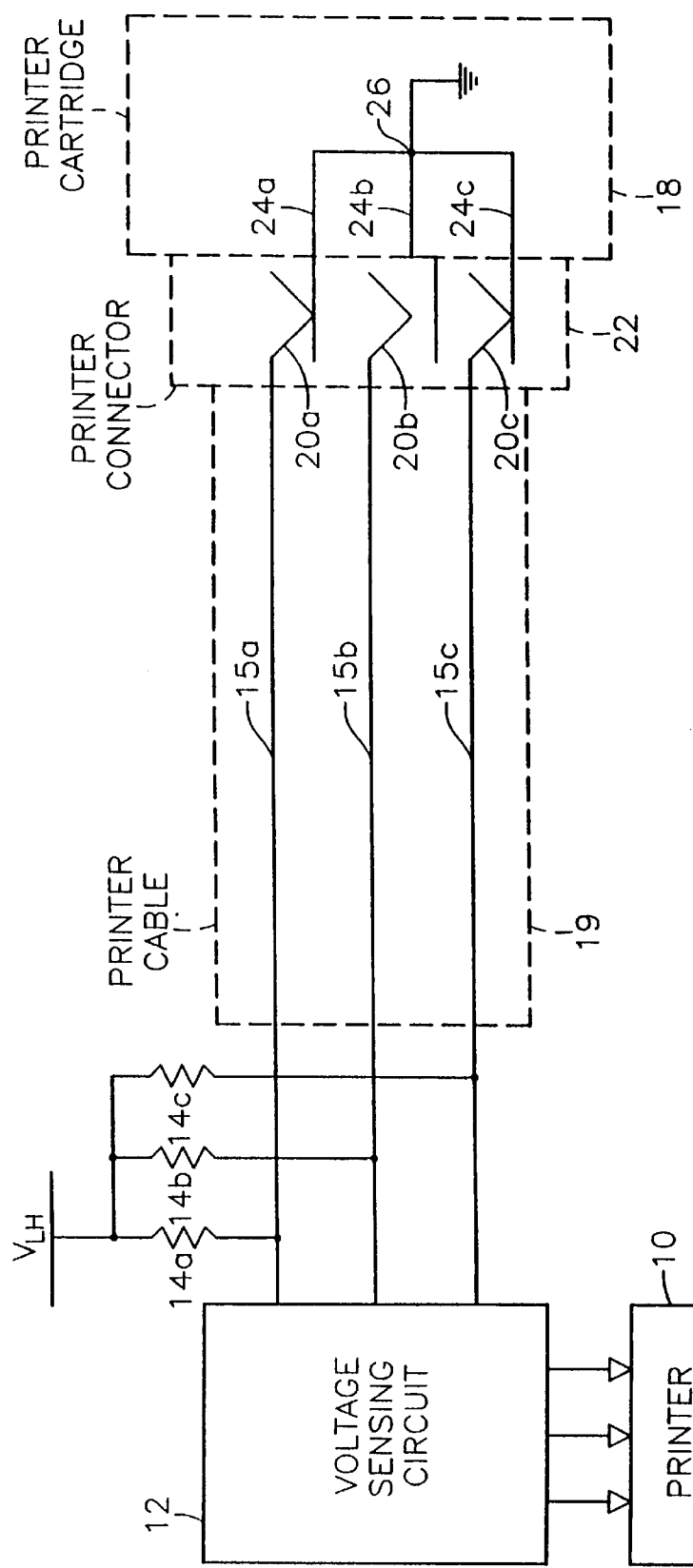
Figure 3A:
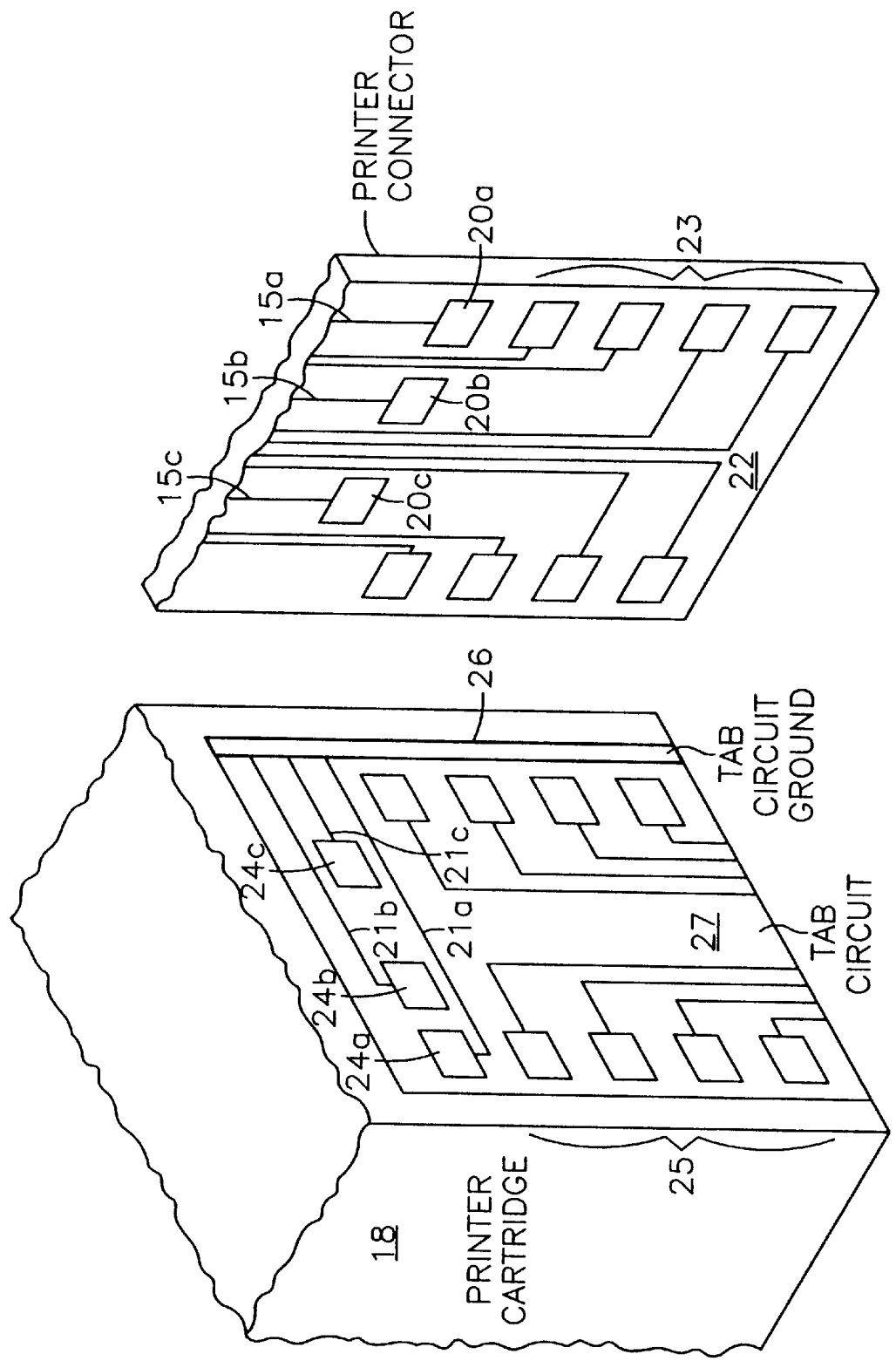
FIG. 3A illustrates identification pads of a printer cartridge identification circuit which are integral with a printhead TAB circuit according to one aspect of the invention.
Figure 3B:
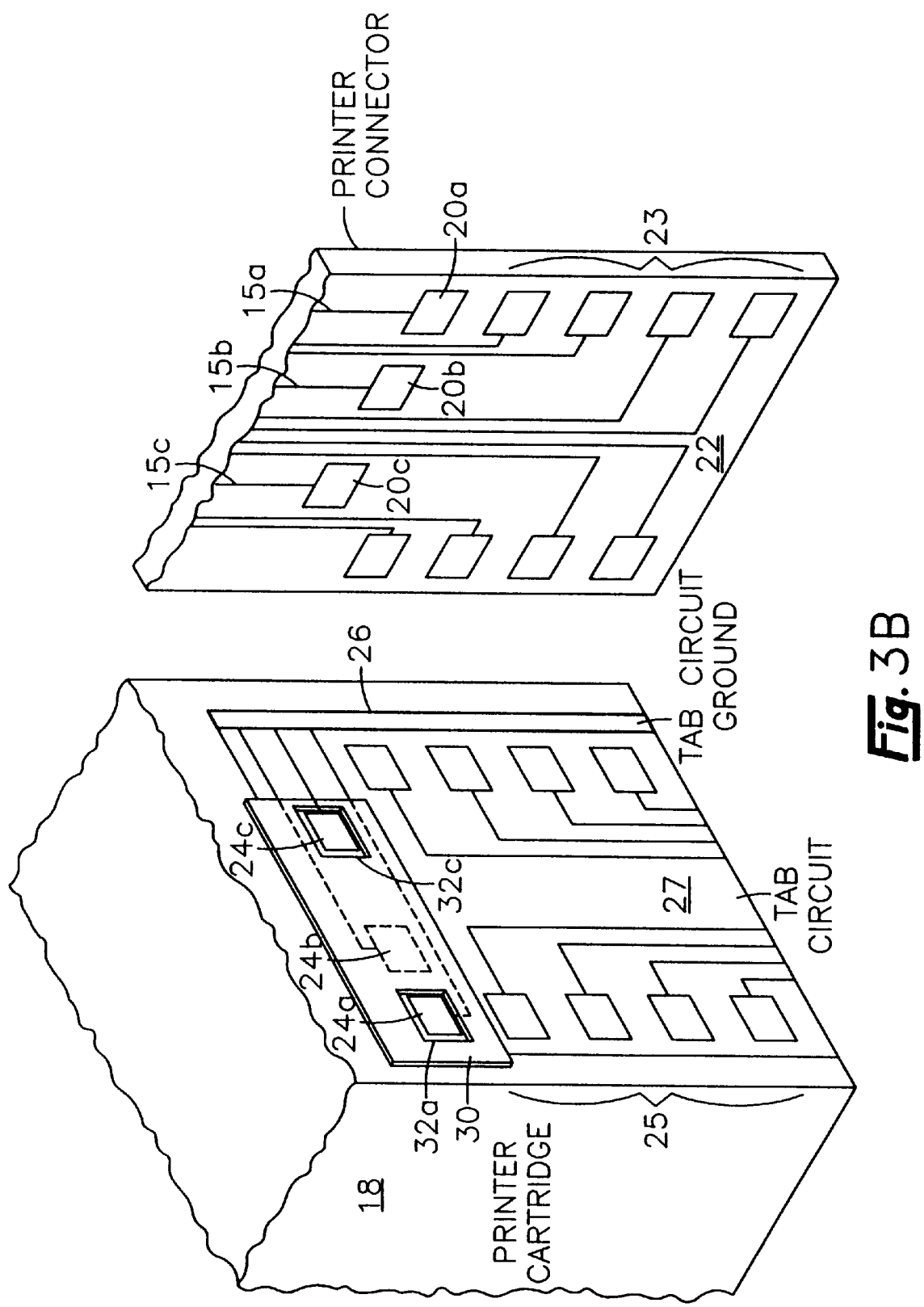
FIG. 3B depicts an encoding label of a printhead identification circuit according to another aspect of the invention.

The schematic of FIG. 2 and the perspective views of FIGS. 3A and 3B illustrate a preferred embodiment of a printer cartridge identification circuit according to the invention. When a replaceable printer cartridge 18 is installed in a thermal ink jet printer, the printer cartridge 18 is in electrical contact with a printer connector 22. The printer connector 22 includes a set of ID contacts 20a, 20b, and 20c which are arranged to make connection to a set of ID pads 24a, 24b, and 24c located on the printer cartridge 18. Preferably, the ID pads 24a, 24b, and 24c are discrete areas of highly conductive material such as gold and copper deposited on a flexible integrated circuit, such as a "TAB" circuit 27 (FIG. 3A). The TAB circuit 27 typically includes many resistor circuit pads (shown generally at 25), and the printer connector 22 typically includes many resistor circuit pad contacts (shown generally at 23) to provide for electrical connection between the printer controller 10 and heating resistors in a printhead on the printer cartridge 18. However, in the interest of clarity, FIG. 3A shows only a few representative resistor circuit pads 25 and resistor circuit pad contacts 23. A TAB circuit ground 26 is also shown in FIG. 3A. A ground potential is supplied from the printer controller 10 to the TAB circuit ground 26 on the TAB circuit 27 through ground lines provided on the printer cable 19. To maintain the simplicity of FIG. 3A, these ground lines are not shown. The ID pads 24a, 24b, and 24c, are electrically connected to a TAB circuit ground 26 via traces 21a, 21b, and 21c. The ID pads 24a, 24b, and 24c are arranged on the TAB circuit 27 to make electrical connection with the ID contacts 20a, 20b, and 20c on the printer connector 22 when the printer connector 22 is connected to the printer cartridge 18.

As shown in FIG. 2, ID lines 15a, 15b, and 15c, which are part of a printer cable 19, have the ID contacts 20a, 20b, and 20c on one end thereof. The other ends of the ID lines 15a, 15b, and 15c are connected to a voltage source $V_{LH}$ through bias resistors 14a, 14b, and 14c, and to a voltage sensing circuit 12 which senses the voltage levels on the ID lines 15a, 15b, and 15c. If an ID contact 20a, 20b, or 20c makes electrical connection with a corresponding ID pad 24a, 24b, or 24c, then the voltage sensing circuit 12 senses that the corresponding ID line 15a, 15b, or 15c is grounded. However, if an ID contact 20a, 20b, or 20c does not make electrical connection with a corresponding ID pad 24a, 24b, or 24c, then the voltage sensing circuit 12 senses voltage $V_{LH}$ on the corresponding ID line 15a, 15b, or 15c.

A method for preventing or permitting one or more ID contacts 20a, 20b, and 20c from making electrical connection with the ID pads 24a, 24b, and 24c is shown in FIG. 3B. An encoding label 30, formed from electrically-nonconductive material such as paper or plastic is adhesively attached to the printer cartridge 18 adjacent to the ID pads 24a, 24b, and 24c. The label 30 has either no aperture, or has one or more apertures, such as the holes 32a and 32c. The label 30 selectively permits or prevents electrical connection between the ID contacts 20a, 20b, and 20c and the corresponding ID pads 24a, 24b, and 24c. For example, when the holes 32a and 32c coincide with the ID pads 24a and 24c, then the ID contacts 20a and 20c make electrical connection with the ID pads 24a and 24c when the printer connector 22 is connected to the printer cartridge 18. However, since there is no hole in the encoding label 30 over the ID pad 24b, the ID contact 20b is prevented from making electrical connection with the sense pad 24b. ID pad 24b is shown in outline form beneath the encoding label 30. The configuration of FIG. 3B is depicted schematically in FIG. 2 which shows the ID contact 20b not touching the ID pad 24b. If the label 30 contains the holes 32a and 32c, and the printer is in operation with the printer connector 22 attached to the printer cartridge 18, then the voltage sensing circuit 12 senses the ID lines 15a and 15c to be grounded, and senses $V_{LH}$ on the ID line 15b.

There are eight possible hole placement configurations using the encoding label 30 over the ID pads 24a, 24b, and 24c. The possible identification codes using three ID pads and pad contacts are shown in FIG. 3C. As will be discussed in greater detail hereinafter, these codes result when using the voltage sensing circuit 12 shown in FIG. 13.

Figure 4A:
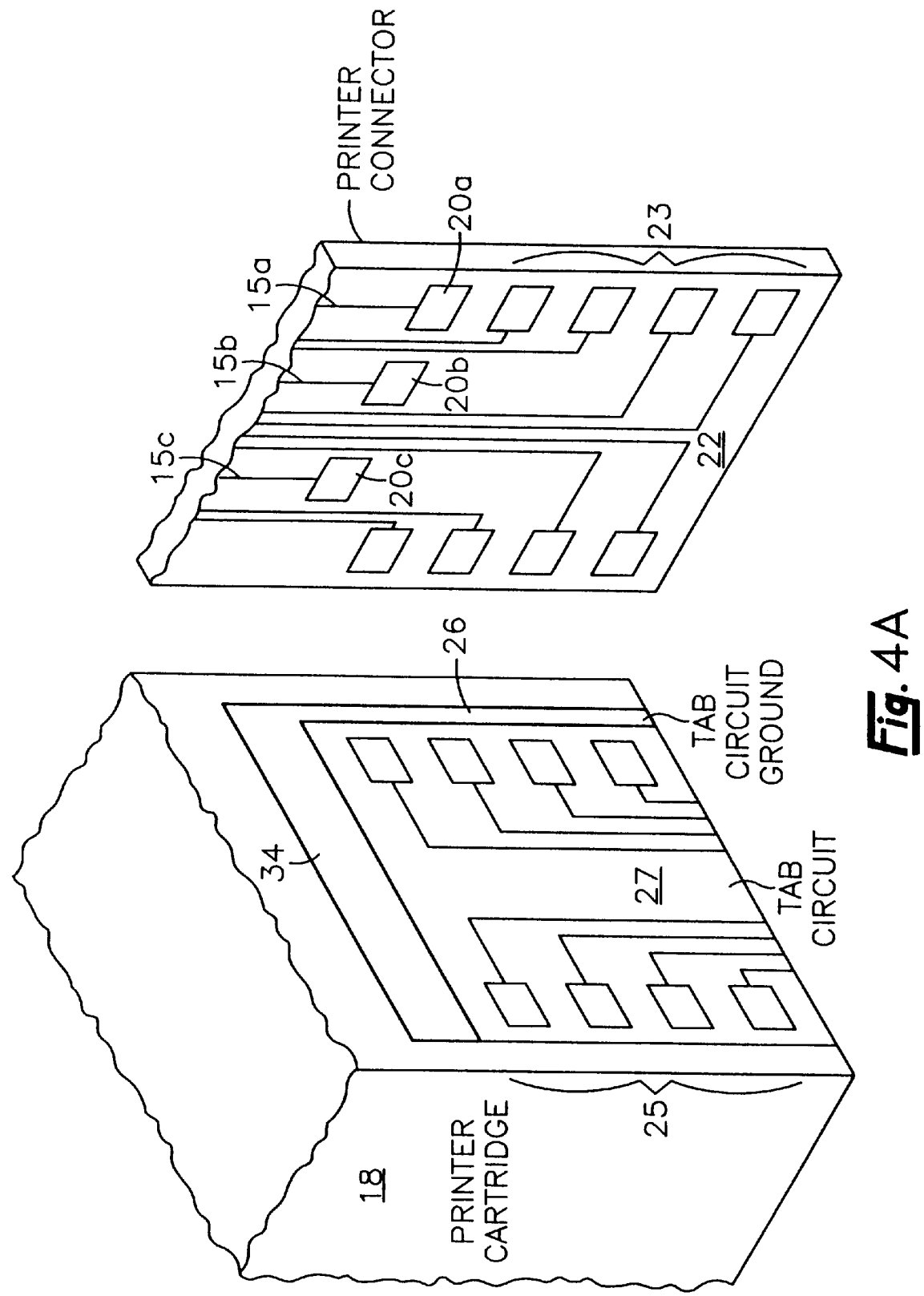
FIG. 4A shows a ground strip of a printer cartridge identification circuit which is integral with a printhead TAB circuit according to the invention.
Figure 4B:
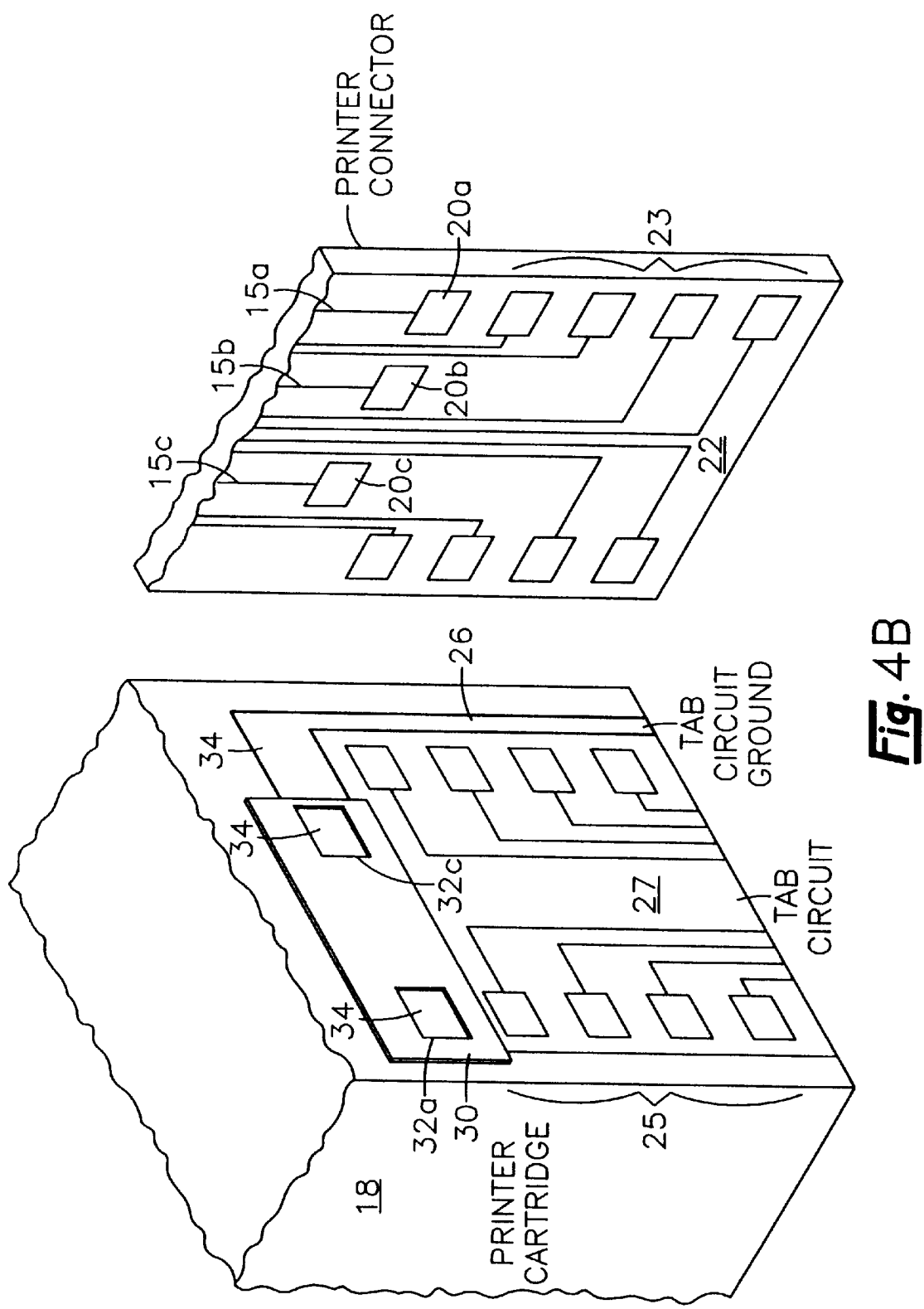
FIG. 4B illustrates an encoding label of a printhead identification circuit attached to a ground strip according to the invention.

An alternative aspect of the invention is shown in FIG. 4A. In this embodiment, the TAB circuit 27 includes a single conductive ground strip 34 instead of individual ID pads as shown in FIGS. 3A and 3B. Although this arrangement provides a different physical configuration compared to the embodiment of FIG. 3A, the function of the ground strip 34 and the ID contacts 20a, 20b, and 20c is similar to the function described with reference to FIGS. 3A and 3B. As shown in FIG. 4B, an encoding label 30 covers a portion of the ground strip 34, thus preventing electrical connection between the ID contact 20b and the ground strip 34. Apertures 32a and 32c expose selected areas of the ground strip 34, thus enabling electrical connection between the ID contacts 20a and 20c and the ground strip 34. In the configuration shown in FIG. 4B, with the printer connector 22 attached to the printer cartridge 18 and the printer in operation, the voltage sensing circuit 12 (FIG. 1) senses the ID lines 15a and 15c to be grounded, and senses $V_{LH}$ on the ID line 15b.

As shown in FIG. 3C, there are eight possible configurations using the encoding label 30 with a printer connector 22 having three ID contacts 20a, 20b, and 20c. The eight corresponding identification codes listed in FIG. 3C result when using the voltage sensing circuit 12 shown in FIG. 13.

Figure 5:
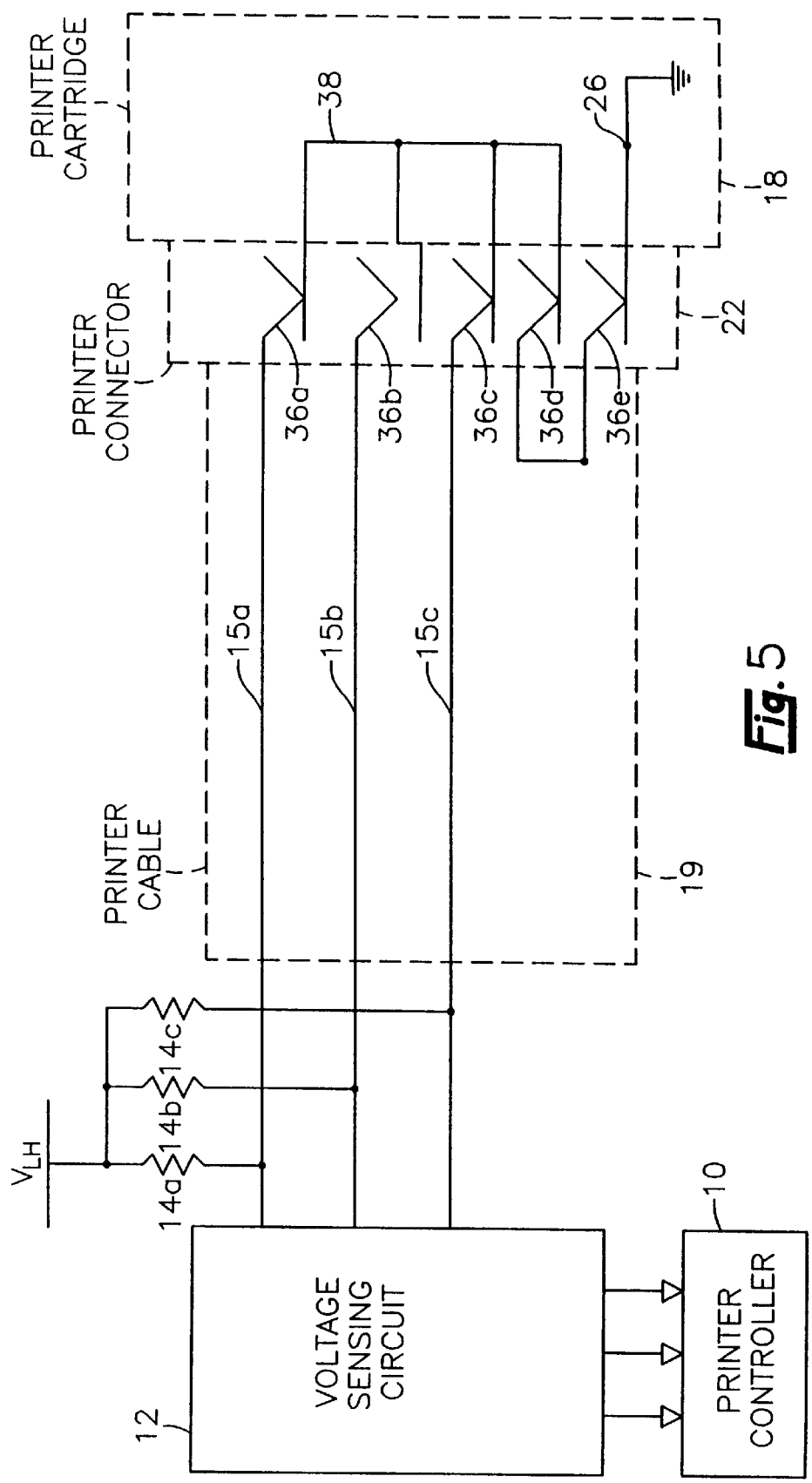
FIG. 5 is a schematic diagram of a printer cartridge identification circuit according to an alternative embodiment of the invention.
Figure 6A:
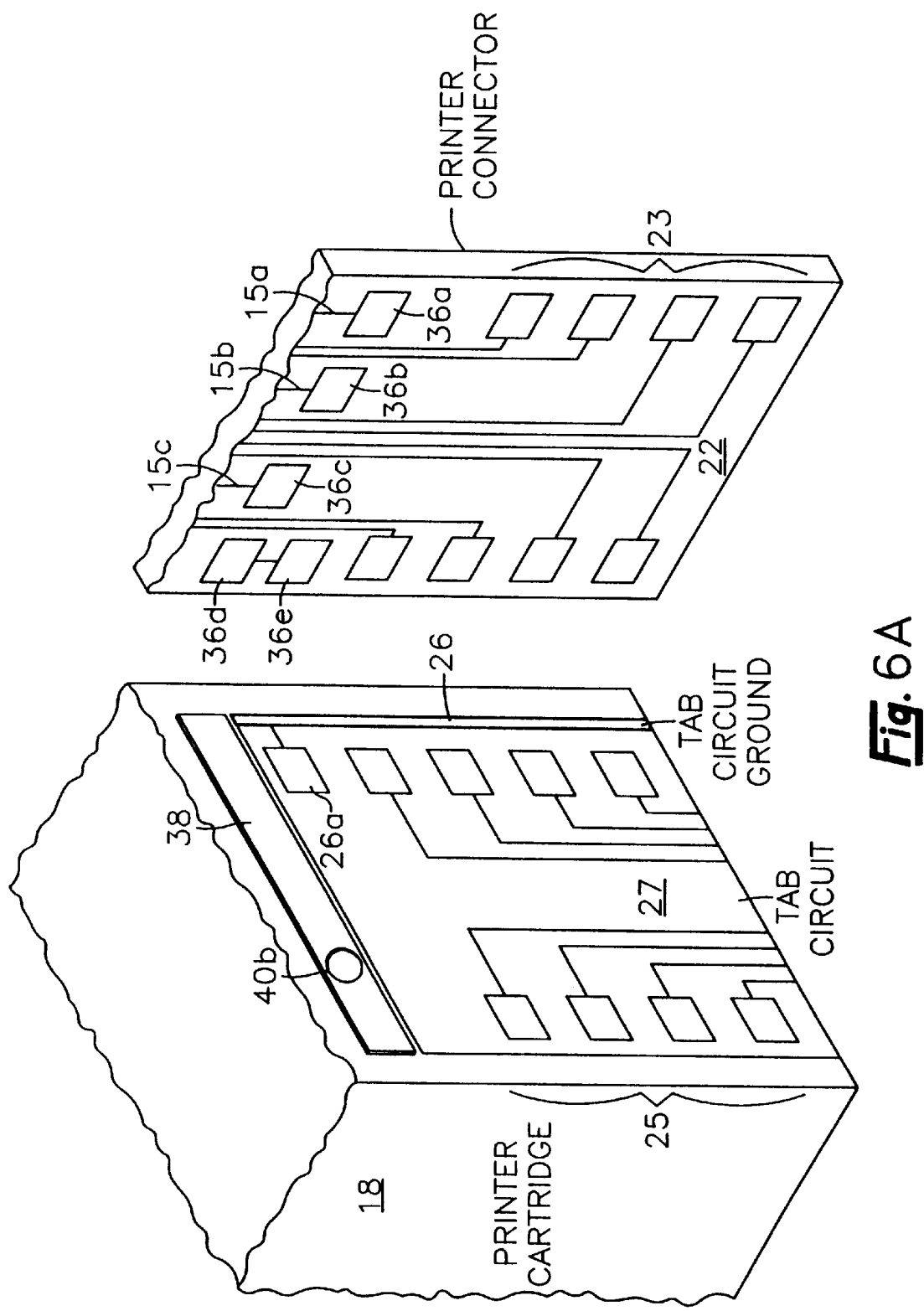
FIG. 6A shows the encoding circuit of a printer cartridge identification circuit which is nonintegral with a printhead TAB circuit according to the invention.

An alternative printer cartridge identification circuit according to the invention is shown in FIG. 5 and FIG. 6A. In this embodiment, an encoding circuit 38 is provided separate from the TAB circuit 27. Because the encoding circuit 38 is separate from the TAB circuit 27, the encoding circuit 38 may be manufactured separately and attached to the printer cartridge 18 at the same or at a different point in the manufacturing process. Although the encoding circuit 38 and the TAB circuit 27 both reside on the printer cartridge 18, there is no permanent electrical connection on the printer cartridge 18 between the two circuits. However, as shown in FIG. 5, the two circuits may be electrically connected when the printer connector ground contact 36d contacts the encoding circuit 38, and the printer connector ground contact 36e, which is electrically connected to the ground contact 36d, contacts the TAB circuit ground pad 26a. Thus, the encoding circuit 38 is grounded to the TAB circuit 27 through the printer connector 22 when the printer connector 22 is attached to the printer cartridge 18.

FIG. 6A depicts one implementation of the circuit described with reference to FIG. 5. In this embodiment, the encoding circuit 38 consists of a single conductive strip, such as a strip of adhesive-backed copper or gold foil, which is attached to the printer cartridge 18 adjacent to the TAB circuit 27. The encoding circuit 38 may also be formed from conductive materials such as copper and gold which have been deposited on the printer cartridge by means such as plating or vapor deposition. When the printer cartridge 18 is attached to the printer connector 22, the encoding circuit 38 makes electrical contact with some, all, or none of the ID contacts 36a, 36b, and 36c on the printer connector 22 depending on the configuration of the encoding circuit 38. The presence or absence of one or more holes in the encoding circuit 38 corresponding to ID contacts 36a, 36b, and 36c provides the encoding scheme for the circuit 38. For example, in the configuration shown in FIG. 6A, a hole 40b exists in the encoding circuit 38 at a location which corresponds with the connection point for the ID contact 36b. Due to the hole 40b, when the printer cartridge 18 is attached to the printer connector 22, the ID contact 36b does not make electrical connection with the encoding circuit 38. Since the printer cartridge 18 of this embodiment is constructed of electrically nonconductive material, there is no electrical continuity between the encoding circuit 38 and the ID contact 36b. However, the ID contacts 36a and 36c, which do make electrical contact with the encoding circuit 38, are electrically grounded. Thus, the voltage sensing circuit 12 (FIG. 5) senses 0 volts on ID lines 15a and 15c, which are connected to ID contacts 36a and 36c respectively, and senses $V_{LH}$ on the ID line 15b which is connected to ID contact 36b.

The configurations of the encoding circuit 38 using the contacts 36a, 36b, and 36c on the printer connector 22 are shown in FIG. 6B. The eight corresponding identification codes listed in FIG. 6B result when using the voltage sensing circuit 12 shown in FIG. 13.

FIGS. 7A and 7B illustrate yet another aspect of the invention. As shown in FIG. 7A, an encoding circuit (indicated generally at 37) consists of selectively-placed encoding pads 39a and 39c and a ground pad 41 formed from electrically-conductive material, such as copper and gold, deposited on a nonconductive adhesive-backed film 40, such as Mylar tape. The encoding circuit 37 is affixed to the printer cartridge 18 in a position which provides for electrical connection to the ID contacts 36a, 36b, and 36c on the printer connector 22. The encoding circuit ground pad 41 makes electrical connection with the ground contact 36d when the printer connector 22 is attached to the printer cartridge 18. One or more of the ID contacts 36a, 36b, and 36c are electrically grounded when one or more of the encoding pads 39a, 39b, and 39c on the encoding circuit 37 are present and are electrically connected to the ground pad 41 via a conductive trace 43. If none of the encoding pads 39a, 39b, and 39c are present, then none of the ID contacts are grounded. For example, as shown in FIG. 7A, the encoding pads 39a and 39c are positioned on the film 40 so as to make electrical contact with the ID contacts 36a and 36c when the printer connector 22 is attached to the printer cartridge 18. In the example of FIG. 7A, no encoding pad exists on the encoding circuit 37 at a location which coincides with the connection point of the ID contact 36b. In this configuration, since the film 40 is formed from electrically nonconductive material, there is no electrical continuity between the ground pad 41 and the ID contact 36b. Therefore, when the printer connector 22 is attached to the printer cartridge 18, and the printer is in operation, the voltage sensing circuit 12 senses 0 volts on the ID lines 15a and 15c which are connected to the ID contacts 36a and 36c respectively, and senses $V_{LH}$ on the ID line 15b which is connected to the ID contact 36b.

The possible configurations of the encoding circuit 37 of this embodiment and the corresponding identification codes are shown in FIG. 7B. The eight corresponding identification codes listed in FIG. 7B result when using the voltage sensing circuit 12 shown in FIG. 13.

Figure 8:
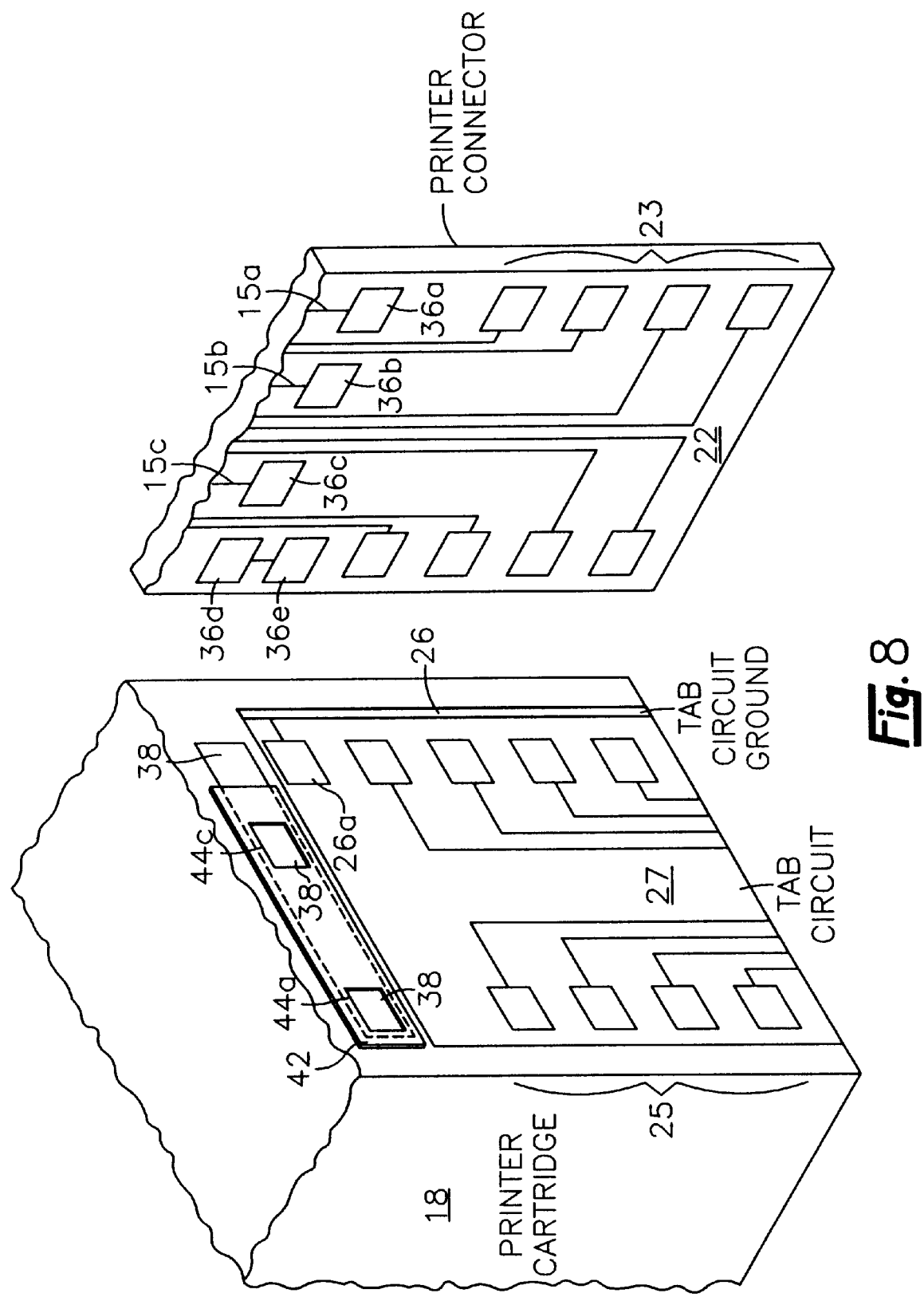
FIG. 8 depicts the encoding circuit of a printer cartridge identification circuit which is nonintegral with a printhead TAB circuit according to the invention.

Another embodiment of the invention is shown in FIG. 8. In this embodiment, the encoding circuit 38 consists of a conductive strip, such as a strip of adhesive-backed copper or gold foil, which is attached to the printer cartridge 18 adjacent to, but separate from, the TAB circuit 27. The encoding circuit 38 may also be formed from conductive materials such as copper and gold which have been deposited on the printer cartridge by means such as plating or vapor deposition. When the printer cartridge 18 is attached to the printer connector 22, the encoding circuit 38 makes electrical contact with some, all, or none of the ID contacts 36a, 36b, and 36c on the printer connector 22 depending on the configuration of an adhesive-backed nonconductive encoding label 42 which selectively covers portions of the encoding circuit 38. As shown in FIG. 8, the encoding label 42 of this embodiment exposes a portion of the encoding circuit 38 which coincides with the connection point of the printer connector ground contact 36d. Thus, the encoding circuit 38 is continuously grounded to the TAB circuit ground pad 26a when the printer connector 22 is attached to the printer cartridge 18.

The presence or absence of one or more holes 44a, 44b, and 44c in the label 42 corresponding to the ID contacts 36a, 36b, and 36c provides encoding for the circuit 38. For example, as shown in FIG. 8, holes 44a and 44c exist in the label 42 at locations which coincide with the connection points of ID contacts 36a and 36c, respectively. Due to the lack of a hole in the encoding label 42 at a location which corresponds to the connection point of the ID contact 36b, the ID contact 36b does not make electrical connection with the encoding circuit 38 when the printer cartridge 18 is attached to the printer connector 22. In this configuration, when the printer is operating, the voltage sensing circuit 12 senses 0 volts on the ID lines 15a and 15c, which are connected to the ID contacts 36a and 36c respectively, and senses $V_{LH}$ on the ID line 15b which is connected to the ID contact 36b.

The configurations of the encoding label 42 of this embodiment and the corresponding identification codes are similar to the configurations and codes shown in FIG. 3C. These identification codes result when using the voltage sensing circuit 12 shown in FIG. 13.

Figure 9:
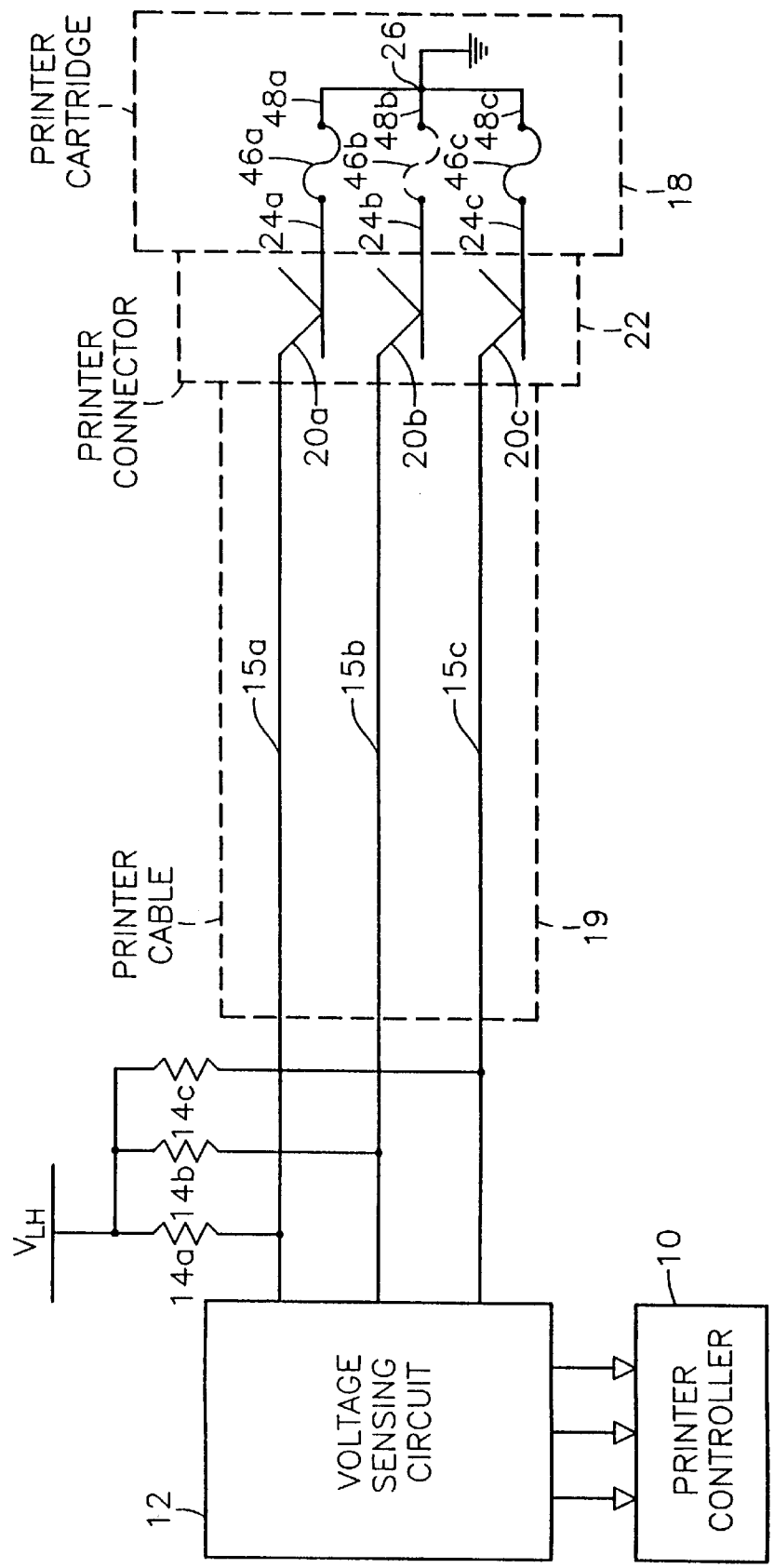
FIG. 9 is a schematic diagram of a printer cartridge identification circuit using fusible links according to the invention.
Figure 10:
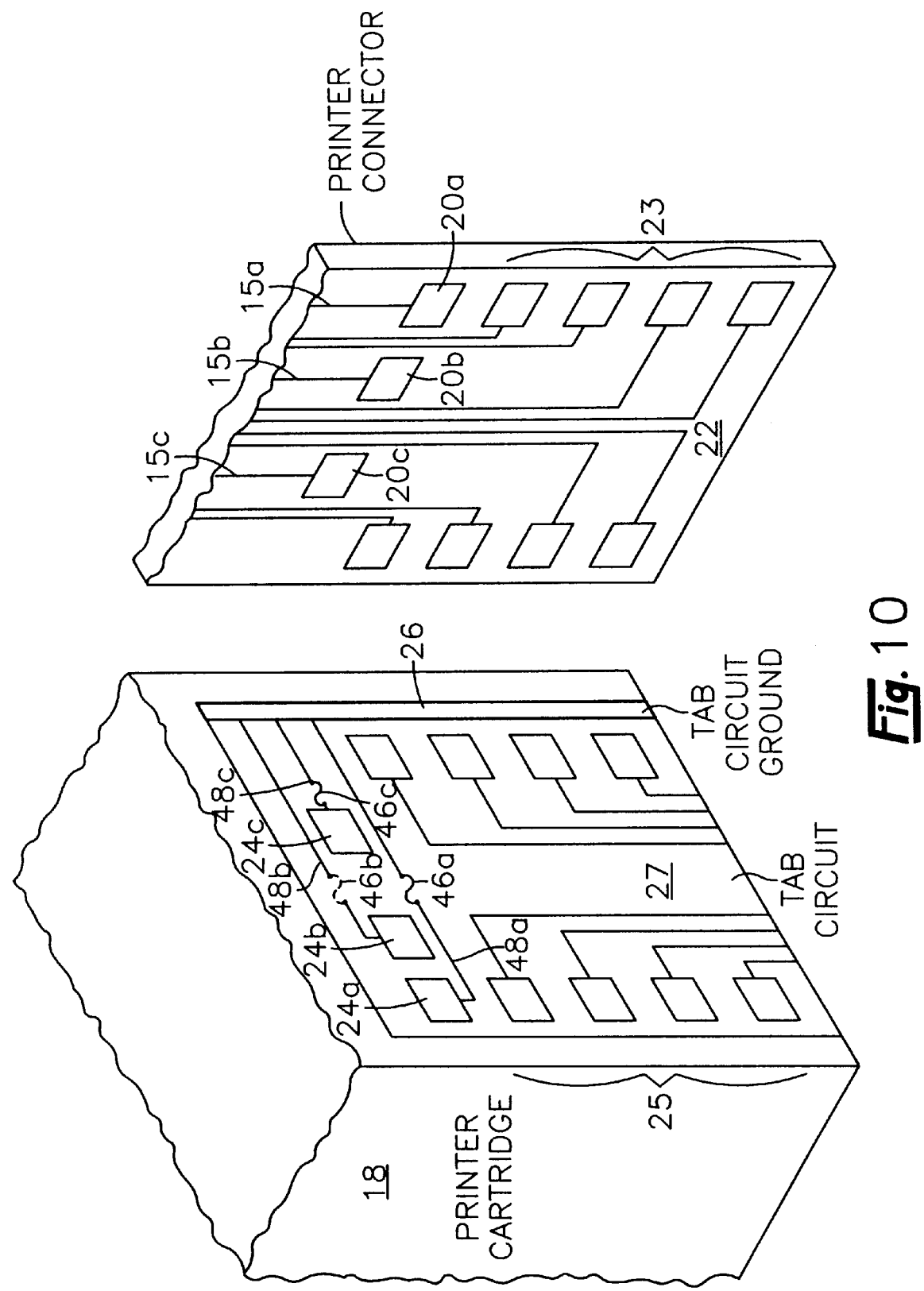
FIG. 10 shows the identification pads and fusible links of a printer cartridge identification circuit which is integral with a printhead TAB circuit according to the invention.

FIGS. 9 and 10 show still another embodiment of the features of the invention. In this embodiment, ID pads 24a, 24b, and 24c are electrically integral with a TAB circuit 27. However, as shown in FIGS. 9 and 10, ID contacts 20a, 20b, and 20c are continuously electrically connected to the ID pads 24a, 24b, and 24c when the printer connector 22 is attached to the printer cartridge 18. Fusible traces 48a, 48b, and 48c are used to electrically connect the ID pads 24a, 24b, and 24c to the TAB circuit ground 26. The traces 48a, 48b, and 48c contain fusible links 46a, 46b, and 46c which can be selectively opened to break the connection between the ID pads 24a, 24b, and 24c and the TAB circuit ground 26. The fusible links 46a, 46b, and 46c are sections of the traces 48a, 48b, and 48c which can be opened by passing an electrical current through them during or at the end of the cartridge manufacturing process. Printer cartridge identification information is encoded by passing a high-current pulse through the trace or traces to be opened, and by not passing a high-current pulse through the trace or traces to remained closed. The high-current pulse opens the fusible link by melting or otherwise burning the link, thus creating an electrical discontinuity in the selected trace. For example, in FIG. 10 the fusible link 46b in the trace 48b is open as indicated by the dotted line, such that no connection exists between the ID pad 24b and the TAB circuit ground 26. In this configuration, when the printer is in operation and the printer connector 22 is connected to the printer cartridge 18, the voltage sensing circuit 12 senses 0 volts on the ID lines 15a and 15c, which are connected to the ID contacts 20a and 20c respectively, and senses $V_{LH}$ on the ID line 15b which is connected to the ID contact 20b.

Figure 11:
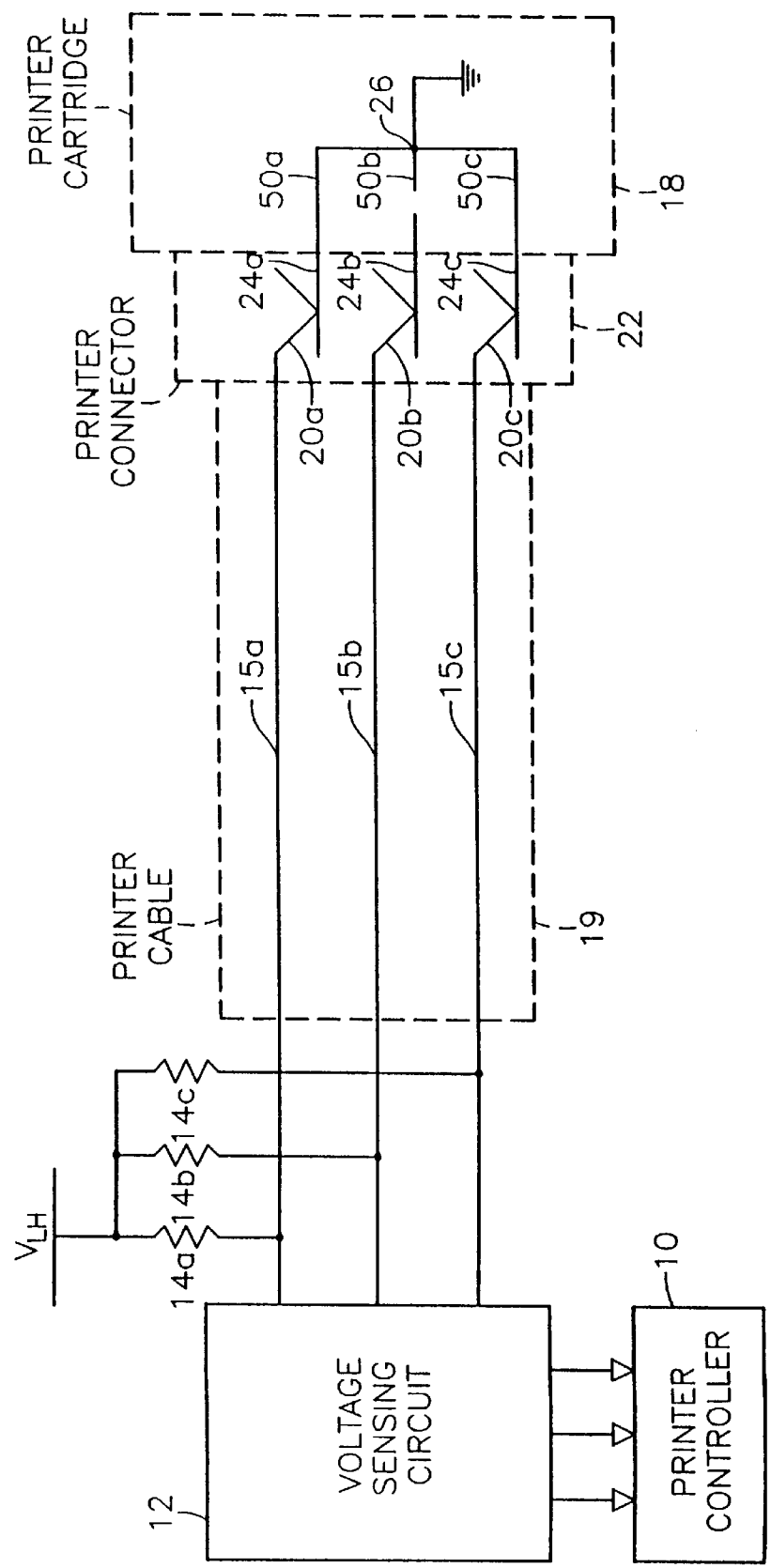
FIG. 11 is a schematic diagram of a printer cartridge identification circuit using trace breaches according to the invention.
Figure 12:
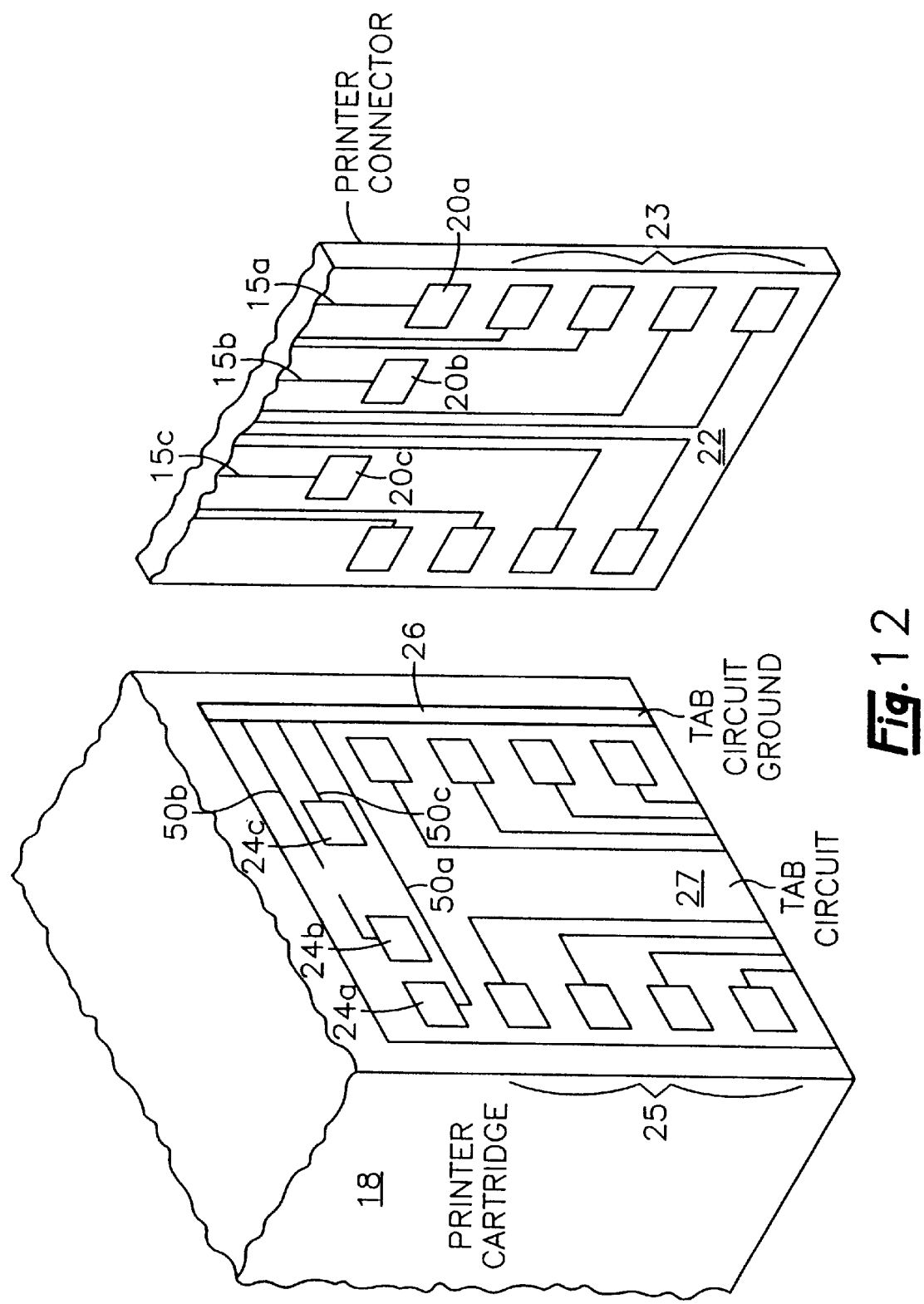
FIG. 12 shows the identification pads and trace breaches of a printer cartridge identification circuit which is integral with a printhead TAB circuit according to the invention.

In FIGS. 11 and 12, the encoding circuit is similar to the circuit shown in FIGS. 9 and 10 with the exception that traces 50a, 50b, and 50c do not contain fusible links. Instead, the printer cartridge identification information is encoded during or at the end of the cartridge manufacturing process by creating a breach in selected traces by methods such as drilling, punching, abrading, or dissolving through portions of the selected traces. For example, in FIG. 12 the trace 50b is discontinuous, thereby electrically isolating the ID pad 24b from the TAB circuit ground 26. In this configuration, when the printer is in operation, the voltage sensing circuit 12 would sense 0 volts on the ID lines 15a and 15c, which are connected to the ID contacts 20a and 20c respectively, and would sense $V_{LH}$ on the ID line 15b which is connected to the ID contact 20b.

Figure 13:
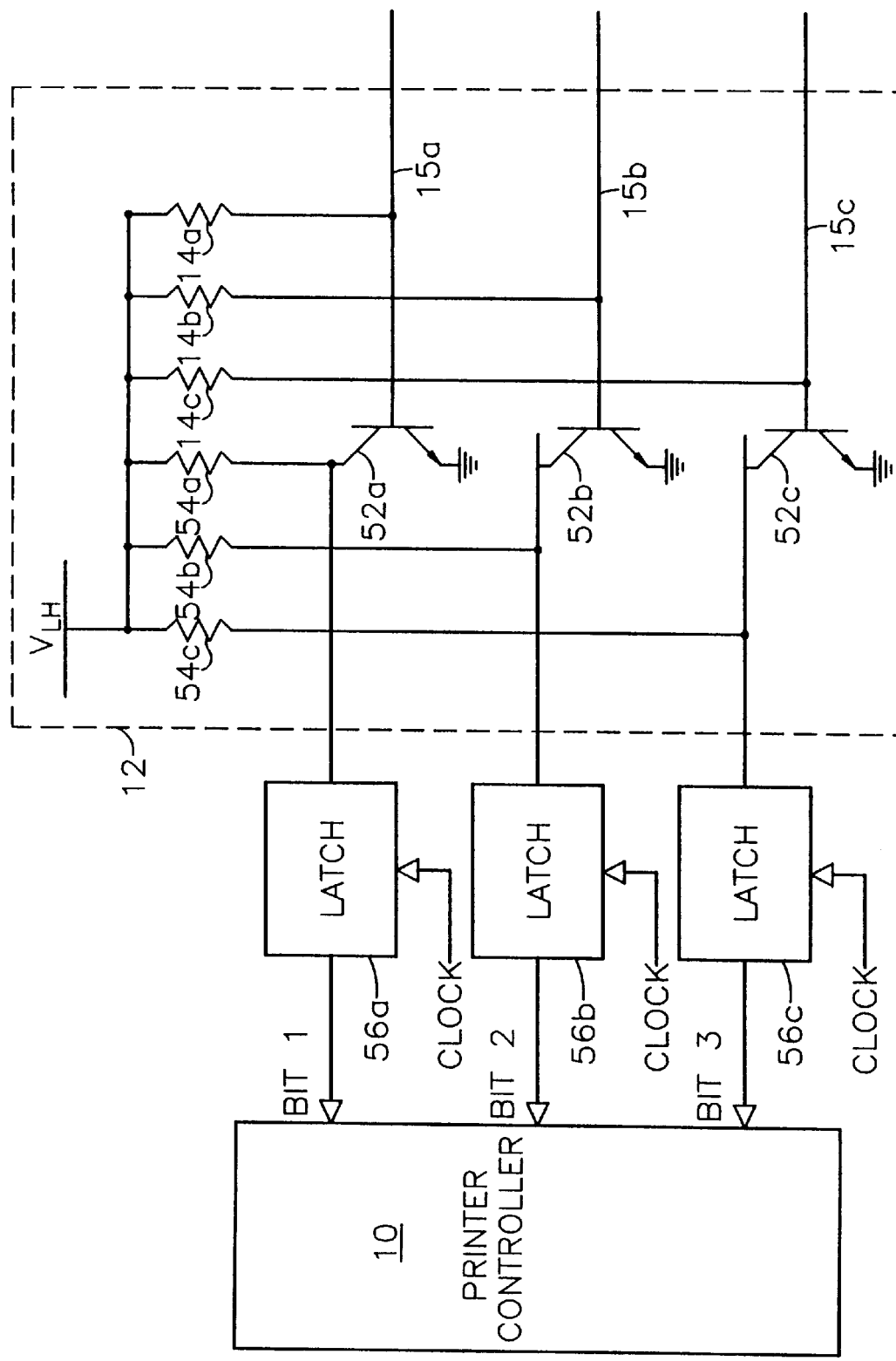
FIG. 13 is a schematic diagram of a preferred embodiment of a voltage sensing circuit according to the invention.

A preferred voltage sensing circuit 12 is shown in FIG. 13. The ID line 15a of the printer cable 19 (FIG. 2) is connected to the base of a bipolar transistor 52a which acts as a switching device. Resistors 54a and 14a establish the proper bias voltages on the collector and the base, respectively, of the transistor 52a. When the ID line 15a is grounded, the transistor 52a is off, and the source voltage $V_{LH}$, which represents logic level one, exists on the collector of transistor 52a. When the ID line 15a is not grounded, $V_{LH}$ exists on the base of the transistor 52a. In this situation, the transistor 52a is switched on, and 0 volts (logic level zero) exists on the collector of the transistor 52a.

Similarly, the ID line 15b is connected to the base of a bipolar transistor 52b. Resistors 54b and 14b establish the proper bias voltages on the collector and the base, respectively, of the transistor 52b. When the ID line 15b is grounded, the transistor 52b is off, and the source voltage $V_{LH}$ (logic level one), exists on the collector of the transistor 52b. When the ID line 15b is not grounded, $V_{LH}$ exists on the base of the transistor 52b thus switching the transistor 52b on. When the transistor 52b is on, 0 volts (logic level zero) exists on its collector.

In a like manner, the ID line 15c is connected to the base of a bipolar transistor 52c. The transistor 52c is off when the ID line 15c is grounded, in which case the source voltage $V_{LH}$ (logic level one) exists on the collector of the transistor 52c. However, when the ID line 15c is not grounded, $V_{LH}$ exists on the base of the transistor 52c. In this situation, the transistor 52c is switched on, and 0 volts (logic level zero) exists on the collector of the transistor 52c.

The voltage levels at the collectors of the transistors 52a, 52b, and 52c are clocked into the latch circuits 56a, 56b, and 56c, respectively. The printer controller 10 then reads the voltage levels on the latch circuits 56a, 56b, and 56c as a 3-bit code which identifies the type of printer cartridge 18 installed in the printer.

It is contemplated, and will be apparent to those skilled in the art from the preceding description and the accompanying drawings that modifications and additions may be made in the embodiments of the invention. For example, while the preferred embodiments implement a three-bit code to identify printer cartridge characteristics, the scope of the invention is not limited to an apparatus for encoding any particular number of bits. Furthermore, the scope of the invention is not limited to the identification of printer cartridges only, but is also applicable to the identification of any type of interchangeable or replaceable accessory cartridge which may be installed in an ink jet printer. For example, the invention is also applicable to the identification of a scanning device cartridge which is installed in place of, or in addition to, a printer cartridge. Accordingly, it is expressly intended that the foregoing description and the accompanying drawings are illustrative of preferred embodiments only, not limiting thereto, and that the spirit and scope of the invention be determined by reference to the following claims.

What is claimed is:

1. An apparatus for providing identification information to a printer controller of a thermal inkjet printer, the information relating to a thermal ink jet printer cartridge, the apparatus comprising:

a printer cable comprising electrically-conductive wires, each wire having a first end and a second end, the first end of each of the wires being electrically connected to a voltage source;

a printer connector having electrically-conductive contacts electrically connected to the second end of the wires, the contacts physically contacting an identification circuit;

the identification circuit disposed upon the printer cartridge, the identification circuit either integral to or separate from a TAB circuit on the cartridge, the identification circuit comprising:

an electrical conductor which is at a reference potential; and a planar label composed of electrically-nonconductive material having an adhesive material on one surface thereof for adhesively attaching the label to the printer cartridge adjacent the electrical conductor to cover and electrically insulate at least a portion of the electrical conductor, the label having no apertures, or one or more apertures which expose one or more areas of the electrical conductor to electrical connection with one or more of the contacts; and an input circuit connected to the first end of each of the wires for sensing which of the wires are at the reference potential, and for providing input signals to the printer controller corresponding to the wires which are at the reference potential.

2. The apparatus of claim 1 wherein the reference potential is ground potential.

3. The apparatus of claim 2 wherein the electrical conductor further comprises one or more sense pads consisting of discrete areas of electrically-conductive material disposed upon the printer cartridge.

4. The apparatus of claim 1 wherein the electrical conductor further comprises one or more sense pads consisting of discrete areas of electrically-conductive material disposed upon the printer cartridge.

5. The apparatus of claim 3 wherein the electrical conductor further comprises:

at least one circuit ground consisting of a discrete area of electrically-conductive material disposed upon the printer cartridge TAB circuit; and traces between the sense pads and the circuit ground, each trace consisting of a discrete area of electrically-conductive material disposed upon the printer cartridge TAB circuit between the sense pads and the circuit ground.

6. The apparatus of claim 1 wherein the input circuit further comprises:

switching devices having at least a first port and a second port, the second port of each switching device being electrically connected to the first end of a corresponding one of the wires, the first port of each switching device assuming a first logic voltage level when the corresponding one of the wires is at an electrical reference potential, and the first port of each switching device assuming a second logic voltage level when the corresponding one of the wires is not at the electrical reference potential; and holding devices having at least an input port and an output port, the input port of each of the holding devices being electrically connected to a first port of a corresponding one of the switching devices, the output port of each of the holding devices being electrically connected to the printer controller, each of the holding devices transferring a logic voltage level at the input port of the holding device to the printer controller.

7. An apparatus for providing identification information to a printer controller of a thermal ink jet printer, the information relating to a thermal ink jet printer cartridge, the cartridge containing a printhead disposed thereon, the printhead having an array circuit of resistive heating elements, the apparatus comprising:

a printer cable comprising electrically-conductive wires, each wire having a first end and a second end;

a printer connector having electrically-conductive contacts electrically connected to the second end of the wires, the contacts physically contacting an identification circuit;

the identification circuit disposed upon the printer cartridge, the identification circuit being integral to a TAB circuit on the cartridge, the identification circuit comprising:

an electrical conductor which is at an electrical reference potential relative to the array circuit of resistive heating elements;

means for precluding none, or one or more of the contacts from being at the reference potential relative to the array circuit of resistive heating elements, the means comprising a planar label composed of electrically-nonconductive material having an adhesive material on one surface thereof for adhesively attaching the label to the printer cartridge adjacent the electrical conductor to cover and electrically insulate at least a portion of the electrical conductor from making electrical connection with the contacts; and means for enabling none, or one or more of the contacts to be at the reference potential relative to the array circuit of resistive heating elements; and an input circuit connected to the first end of each of the wires for sensing which of the wires are at the reference potential relative to the array circuit of resistive heating elements, and for providing input signals to the printer controller corresponding to the wires which are at the reference potential.

8. The apparatus of claim 7 wherein the reference potential is ground potential.

9. The apparatus of claim 7 wherein the means for enabling none, or one or more of the contacts to be at the reference potential relative to the array circuit of resistive heating elements comprise no aperture, or one or more apertures disposed in the label to expose none of, or one or more portions of the electrical conductor for electrical connection with the contacts.

10. The apparatus of claim 7 wherein the input circuit further comprises:

switching devices having at least a first port and a second port, the second port of each switching device being electrically connected to the first end of a corresponding one of the wires, the first port of each switching device assuming a first logic voltage level when the corresponding one of the wires is at the reference potential relative to the array circuit of resistive heating elements, and the first port of each switching device assuming a second logic voltage level when the corresponding one of the wires is not at the reference potential relative to the array circuit of resistive heating elements; and holding devices having at least an input port and an output port, the input port of each of the holding devices being electrically connected to a first port of a corresponding one of the switching devices, the output port of each of the holding devices being electrically connected to the printer controller, each of the holding devices transferring a logic voltage level at the input port of the holding device to the printer controller.

11. The apparatus of claim 7 wherein the electrical conductor further comprises:

sense pads, each sense pad consisting of a discrete area of electrically-conductive material disposed upon the printer cartridge;

a circuit ground which is electrically grounded relative to the array circuit of resistive heating elements; and traces between the sense pads and the circuit ground, each trace consisting of a discrete area of electrically-conductive material disposed upon the printer cartridge between the sense pads and the circuit ground.

12. The apparatus of claim 11 wherein the planar label is attached to the printer cartridge adjacent the sense pads to cover and electrically insulate none, or one or more of the sense pads from contact with the one or more contacts.

13. The apparatus of claim 12 wherein the means for enabling none, or one or more of the contacts to be at the reference potential relative to the array circuit of resistive heating elements comprise no aperture, or one or more apertures disposed in the label to expose none, or one or more of the sense pads to electrical connection with the one or more contacts.

14. An apparatus for use with a thermal ink jet printer which is capable of accommodating different types of accessory cartridges, the apparatus providing information to an accessory controller to identify the type of accessory cartridge installed in the ink jet printer, the apparatus comprising:

a printer cable comprising electrically-conductive wires, each wire having a first end and a second end, the first end of each of the wires being electrically connected to a voltage source;

a printer connector having electrically-conductive contacts electrically connected to the second end of the wires, the contacts physically contacting an identification circuit;

the identification circuit disposed upon the accessory cartridge, the identification circuit comprising:

an electrical conductor which is at a reference potential;

a planar label composed of electrically-nonconductive material having an adhesive material on one surface thereof for adhesively attaching the label to the accessory cartridge adjacent the electrical conductor to cover and electrically insulate at least a portion of the electrical conductor, the label having no apertures, or one or more apertures which expose one or more areas of the electrical conductor to electrical connection with one or more of the contacts; and an input circuit connected to the first end of each of the wires for sensing which of the wires are at the reference potential, and for providing input signals to the accessory controller corresponding to the wires which are at the reference potential.

15. The apparatus of claim 14 wherein the reference potential is ground potential.

16. The apparatus of claim 14 wherein the electrical conductor further comprises one or more sense pads consisting of discrete areas of electrically-conductive material disposed upon the accessory cartridge.

17. The apparatus of claim 16 wherein the electrical conductor further comprises:

at least one circuit ground consisting of a discrete area of electrically-conductive material disposed upon the accessory cartridge; and traces between the sense pads and the circuit ground, each trace consisting of a discrete area of electrically-conductive material disposed upon the accessory cartridge between the sense pads and the circuit ground.

18. The apparatus of claim 14 wherein the input circuit further comprises:

switching devices having at least a first port and a second port, the second port of each switching device being electrically connected to the first end of a corresponding one of the wires, the first port of each switching device assuming a first logic voltage level when the corresponding one of the wires is at an electrical reference potential, and the first port of each switching device assuming a second logic voltage level when the corresponding one of the wires is not at the electrical reference potential; and holding devices having at least an input port and an output port, the input port of each of the holding devices being electrically connected to a first port of a corresponding one of the switching devices, the output port of each of the holding devices being electrically connected to the accessory controller, each of the holding devices transferring a logic voltage level at the input port of the holding device to the accessory controller.

19. An apparatus for use with a thermal ink jet printer which is capable of accommodating different types of accessory cartridges, the apparatus providing information to an accessory controller to identify the type of accessory cartridge installed in the ink jet printer, the apparatus comprising:

a printer cable comprising electrically-conductive wires, each wire having a first end and a second end;

a printer connector having electrically-conductive contacts electrically connected to the second end of the wires, the contacts physically contacting an identification circuit;

the identification circuit disposed upon the accessory cartridge, the circuit comprising:

an electrical conductor which is at an electrical reference potential;

means for precluding none, or one or more of the contacts from being at the reference potential, the means comprising a planar label composed of electrically-nonconductive material having an adhesive material on one surface thereof for adhesively attaching the label to the accessory cartridge adjacent the electrical conductor to cover and electrically insulate at least a portion of the electrical conductor from making electrical connection with the contacts; and means for enabling none, or one or more contacts to be at the reference potential; and an input circuit connected to the first end of each of the wires for sensing which of the wires are at the reference potential, and for providing input signals to the accessory controller corresponding to the wires which are at the reference potential.

20. The apparatus of claim 19 wherein the reference potential is ground potential.

21. The apparatus of claim 19 wherein the means for enabling none, or one or more of the contacts to be at the reference potential comprise no aperture, or one or more apertures disposed in the label to expose none, or one or more portions of the electrical conductor for electrical connection with the contacts.

22. The apparatus of claim 19 wherein the input circuit further comprises:

switching devices having at least a first port and a second port, the second port of each switching device being electrically connected to the first end of a corresponding one of the wires, the first port of each switching device assuming a first logic voltage level when the corresponding one of the wires is at the reference potential, and the first port of each switching device assuming a second logic voltage level when the corresponding one of the wires is not at the reference potential; and holding devices having at least an input port and an output port, the input port of each of the holding devices being electrically connected to a first port of a corresponding one of the switching devices, the output port of each of the holding devices being electrically connected to the accessory controller, each of the holding devices transferring a logic voltage level at the input port of the holding device to the accessory controller.

23. The apparatus of claim 19 wherein the electrical conductor further comprises:

sense pads, each sense pad consisting of a discrete area of electrically-conductive material disposed upon the accessory cartridge;

a circuit ground which is at an electrical reference potential; and traces between the sense pads and the circuit ground, each trace consisting of a discrete area of electrically-conductive material disposed upon the accessory cartridge between the sense pads and the circuit ground.

24. The apparatus of claim 23 wherein the planar label is attached to the accessory cartridge adjacent the sense pads to cover and electrically insulate none, or one or more of the sense pads from contact with the one or more contacts.

25. The apparatus of claim 24 wherein the means for enabling none, or one or more of the contacts to be at the reference potential comprise no aperture, or one or more apertures disposed in the label to expose none, or one or more of the sense pads to electrical connection with the one or more contacts.

* * * * *